United States Patent [19]

Itoh et al.

[11] Patent Number: 5,593,761
[45] Date of Patent: Jan. 14, 1997

[54] ELECTRON BEAM SHAPING MASK FOR AN ELECTRON BEAM SYSTEM WITH PATTERN WRITING CAPABILITY

[75] Inventors: Katsuyuki Itoh; Hiroshi Yamashita, both of Tokyo, Japan

[73] Assignee: NEC Corporation, Tokyo, Japan

[21] Appl. No.: 458,849

[22] Filed: Jun. 2, 1995

[30] Foreign Application Priority Data

Jun. 2, 1994 [JP] Japan .................................. 6-142233

[51] Int. Cl.⁶ ................................................. B32B 9/00
[52] U.S. Cl. ............................ 428/210; 430/5; 430/296; 430/313; 430/321; 430/396; 430/395; 430/494; 359/851; 369/101; 428/195
[58] Field of Search .............................. 430/5, 296, 313, 430/321, 396, 395, 494; 359/851; 369/101; 428/195, 210

[56] References Cited

U.S. PATENT DOCUMENTS

| | | | |
|---|---|---|---|
| 4,417,946 | 11/1983 | Bohlen et al. | 430/313 |
| 4,451,544 | 5/1984 | Kawabuchi | 430/5 |
| 4,855,197 | 8/1989 | Zapka et al. | 430/5 |
| 5,234,781 | 8/1993 | Sakamoto et al. | 430/5 |
| 5,334,282 | 8/1994 | Nakayama et al. | 430/5 |

OTHER PUBLICATIONS

"Electron-beam cell projection lithography: A new high-throughput electron-beam direct-writing technology using a specially tailored Si aperture;" Y. Nakayama et al.; American Vacuum Society; Nov./Dec. 1990; pp. 1836–1840.

"Thermal Characteristics of Si Mask for EB Cell Projection Lithography"; Yoshinori Nakayama et al.; Jpn. J. Appl. Phys. vol. 31 (1992); pp. 4268–4272.

*Primary Examiner*—Patrick Ryan
*Assistant Examiner*—Cathy Lam
*Attorney, Agent, or Firm*—Whitham, Curtis, Whitham & McGinn

[57] ABSTRACT

An electron beam shaping mask for an electron beam with pattern writing capability, includes a substrate with various opening patterns and metallic films, which are respectively formed on top- and bottom-surfaces of the substrate. The metallic films serve as foundation metallic layers. According to the structure, a total thickness of the metallic layer is divided into the two thin metallic films. Since the substrate is protected from both sides by the metallic films, its thickness can be made to be thin. Therefore, a highly accurate patterning can be easily performed, and thermal stresses can be decreased and exfoliations of the metallic films can be avoided.

20 Claims, 5 Drawing Sheets

ELECTRON BEAM SHAPING MASK FOR AN ELECTRON BEAM SYSTEM WITH PATTERN WRITING CAPABILITY

FIELD OF THE INVENTION

The invention relates to an electron beam shaping mask used in an electron beam system with pattern writing capability, and especially to an electron beam shaping mask for highly precise and fine patternings used in an electron beam system with pattern writing capability and cell projecting function.

BACKGROUND OF THE INVENTION

An electron beam system with pattern writing capability has come to be widely used in a fabricating process of an ultra-large-scale integrated circuit (ULSI, hereinafter) with the highly accurate and fine patterings, because the minimum feature size of the ULSI exceeds the limitations of optical resolution. Particularly, the electron beam cell projection lithography has attracted engineers in this field, because of its high throughput property. The aforementioned lithography and a mask used in this technology are described in two following literatures. One is "Thermal Characteristics of Si Mask for EB Cell Projection Lithography" by Y. NAKAMURA, H. SATOH and Others, which appeared on Jpn. J. Appl. Phys., Vol. 31 (1992) pp. 4268–4272, Part 1, No. 12B, Dec. 1992. Another one is "Electron-Beam Cell Projection Lithography: A new high-throughput electron-beam direct-writing technology using a specially tailored Si aperture", by Y. NAKAMURA, S. OKAZAKI, and N. SATOH, which appeared on J. Vac. Sci. Technol. B8 (6), Nov/Dec, 1990.

In the electron beam system with pattern writing capability, an electron beam irradiated from an electron gun is shaped into a beam with a rectangular cross-section with desired dimensions by a first beam shaping mask. Thereafter, the electron beam is again shaped into a beam with a cross-section having various miniaturized patterns by a second beam shaping mask. In the beam shaping mask, a Si-substrate is used as a basic component, the top-surface of which is plated by Au. The Si-substrate is used because of its accuracy in the fabrication process, and the Au-film has a role to increase the electron beam intercepting capability.

In order to obtain highly accurate opening patterns, the thickness of the Si-substrate should be decreased, and then the thickness of the Au-film should be increased to secure the electron beam intercepting capability. Subsequently, large thermal stresses arise between the Si-substrate and the Au-film, and the exfoliations of the Au-film may arise. Moreover, since there is no metallic film on the bottom surface of the Si-substrate, electric charges may be stored thereon, and the electron beam may be deformed by electrostatic forces between the electron beam and the electric charges stored on the bottom surface of the Si-substrate.

SUMMARY OF THE INVENTION

Accordingly, it is an object of the invention to provide a mask for an electron beam system with pattern writing capability, which firstly has opening patterns with high accuracy, secondly has an improved capability to intercept an electron beam with high energy, thirdly can prevent exfoliations of plated metallic films, covering the surfaces of the mask itself, and fourthly can protect the mask itself from being charged by the electron beam, and protect the electron beam from deformation of its path caused by electrostatic force between the electron beam and electric charges stored on the mask.

According to the aforementioned feature of the invention, an electron beam shaping mask for an electron beam system with pattern writing capability comprises:

a substrate patterned with prescribed opening patterns, and metallic films, which cover whole top- and bottom-surfaces of said substrate except said prescribed patterns.

BRIEF DESCRIPTION OF THE DRAWINGS

The invention will be explained in more detail in conjunction with appended drawings, wherein.

DESCRIPTION OF THE PREFERRED EMBODIMENTS

Before explaining the electron beam shaping mask for an electron beam system with pattern writing capability in the preferred embodiments according to the invention, the aforementioned conventional electron beam shaping mask in FIG. 1 and FIGS. 2A–2D will be explained.

Figure 1:
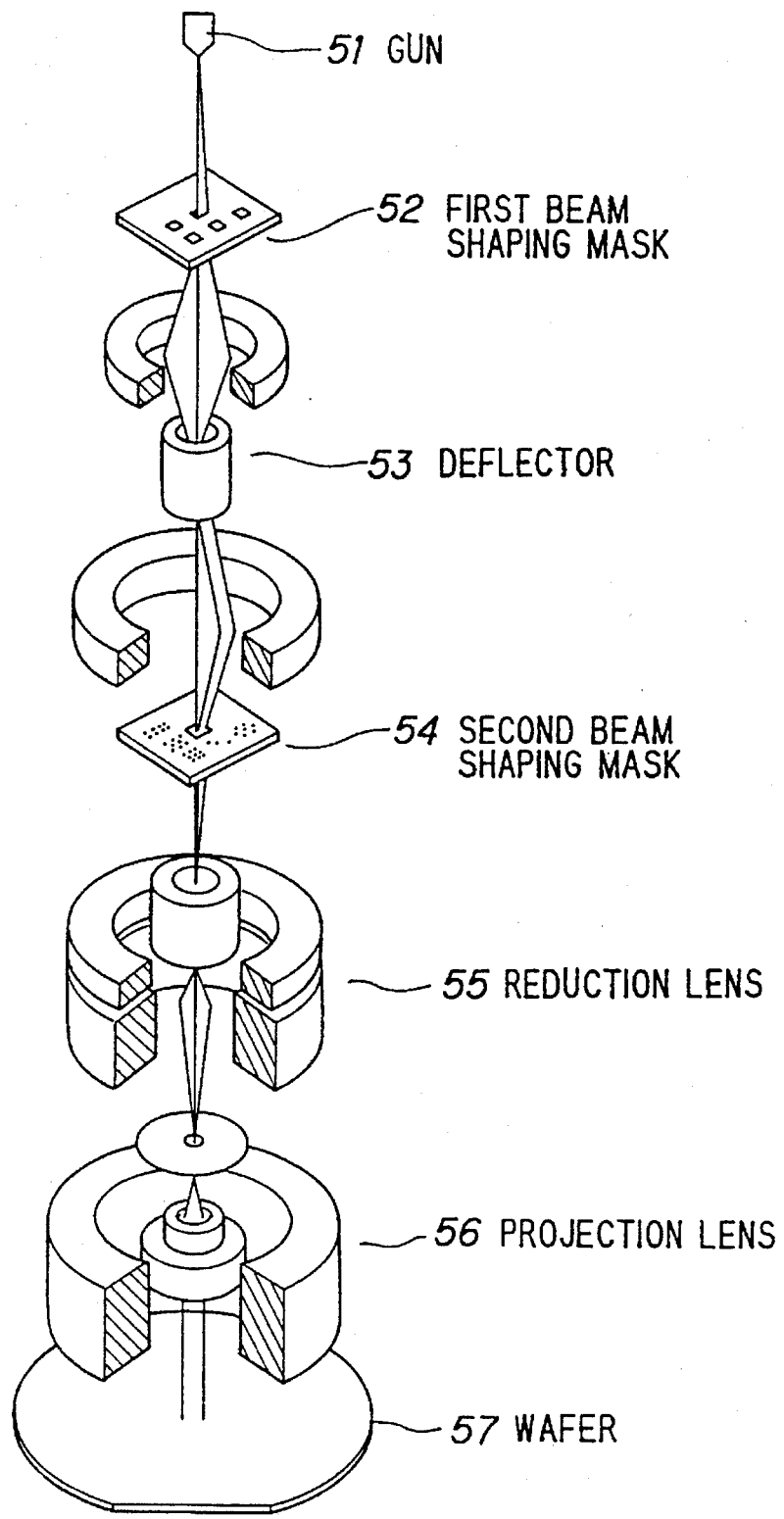
FIG. 1 is a schematic representation of the outline of a conventional electron beam system with pattern writing capability.

FIG. 1 is the schematic representation of the outline of the structure of an electron beam system with pattern writing capability. As shown in this drawing, an electron beam irradiated from an electron gun 51 is shaped by a first mask 52 and deflected by a deflector 53 and is incident on a second mask 54, where the cross-section of the electron beam is shaped into a plurality of desired patterns. Then the electron beam irradiates the wafer 57, after passing through a reduction lens 55 and a projection lens 56, and patterns electron-beam-resists on the wafer 57.

As shown in the aforementioned literature, the mask, being used in the electron beam system of this type, is made of Si, in order to obtain high accuracy in fabrication. FIGS. 2A–2D are cross-sectional views, which represent fabricating processes of the conventional mask, being shown in the later literature mentioned above.

Figure 2A:
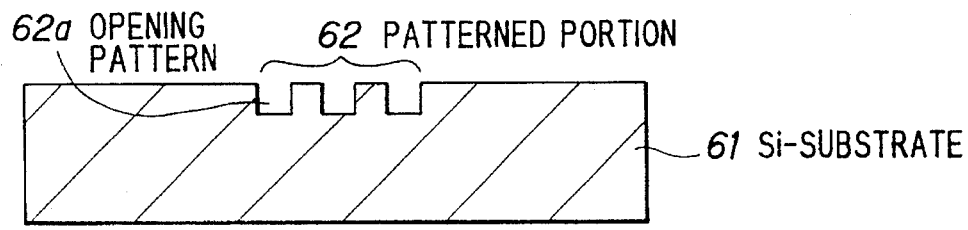
FIGS. 2A–2D are cross-sectional views, showing each step of fabricating process of the conventional patterned portion in regular sequence.
Figure 2B:
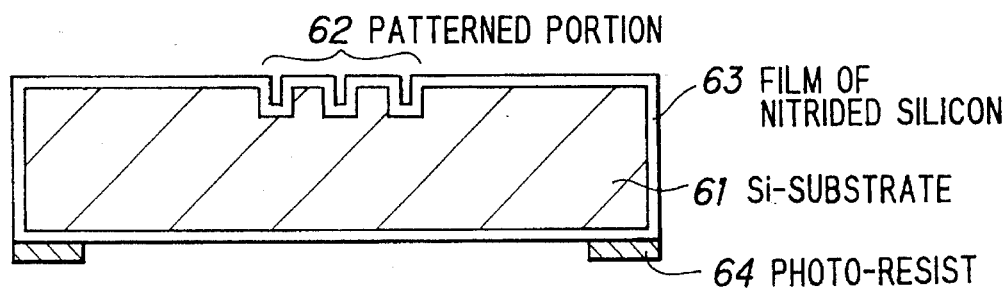

Opening-patterns 62*as* with desired shapes are formed by applying photolithography and dry-etching methods to a patterned portion 62 on a Si-substrate 61, wherein depths of the opening-patterns 62*as* are 20 μm, as shown in FIG. 2A. Next, the whole surface of the processed substrate 61 is covered with a film of nitride silicon 63 and a photo-resist 64 with a desired opening pattern is formed on the bottom surface of the processed substrate 61, as shown in FIG. 2B.

Figure 2C:
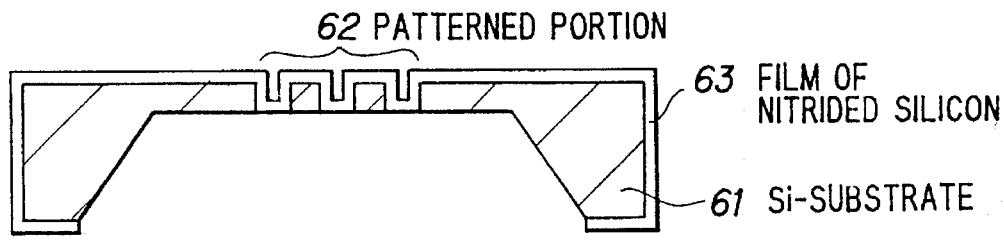
Figure 2D:
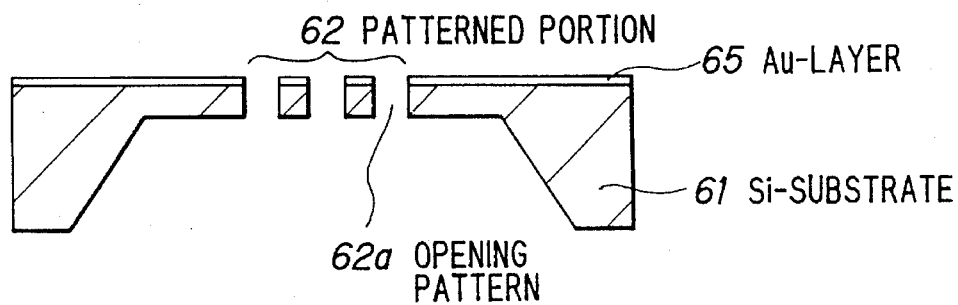

Then, the nitride silicon film 63 is selectively removed by the aid of the photo-resist 64, which serves as a mask, and the processed substrate 61 is etched by an isotropic wet-etching from a bottom surface thereof, and the thickness of the patterned portion 62 becomes 20 µm, as shown in FIG. 2C. Finally, the nitride silicon film 63 is removed and an Au-layer 65, which prevents the charge storing on the top-surface of the substrate, as shown in FIG. 2D.

Still more, the original thickness of the Si-substrate is 500 µm. The thickness of the Au-layer is not shown in the above mentioned literature, but it is about 0.5 µm at present.

It is extremely important to form the opening-patterns with high accuracy, because the accuracy of patterns written on the wafer is directly affected by those of the aforementioned opening-patterns. In the mask used in said electron beam system, the opening-patterns 62as, which will be shaped into through-hole patterns in a later step, are formed by photo-resist process and dry-etching, from the view points of facility and accuracy in fabrication. However, it is difficult to etch an opening-pattern 62a to the depth of 20 µm, keeping an etching-taper-angle 90°. Particularly, when an older model etching equipment, in which the degree of vacuum is low and the temperature control is inaccurate, is used the accuracy of etching becomes abruptly low, in a case where the etching depth becomes larger than 15 µm.

Accordingly, the reasons why opening-patterns 62as do not agree with the photo-resist patterns (mask patterns) can be summarized follows.

(1) In the etching process, etching and deposition progress simultaneously, and therefore, in the case of a deep opening-pattern, depositions at top- and bottom-portions are unequal to each other. Then, it becomes difficult to make a side wall of the opening-pattern perpendicular to the top- and bottom-surfaces of the substrate.

(2) Since resist-etching-selectivity of Si is less than 20 and not so high, the mask is etched in itself, and its cross-sectional view becomes trapezoidal, as etching progresses. The shape of the opening-pattern of Si is affected also by the shape of said etched mask, and becomes tapered. Therefore, it is inevitable that a taper angle of 88°–89° arises in the side wall of the opening pattern, even when the most advanced technologies are applied.

The maximum energy of the electron beam, which can be intercepted by the conventional patterned portion, comprising the 20 µm thick Si-substrate with a 0.5 µm thick plated metal, is 50 keV as mentioned later. Accordingly, in a case where the depth of the opening-pattern, in other words the thickness of the substrate on the patterned portion, is less than 20 µm, said silicon substrate loses the function to intercept the electron beam, and then, it becomes impossible to write the patterns on the wafer with high resolution. Hence, decreasing the thickness of the substrate and increasing that of the plated metal may be contemplated. However, if the thickness of the metallic layer is increased keeping the structure of the patterned portion uncharged, the metallic layer is apt to be exfoliated by the concentration of a thermal stress which is caused by the difference between thermal expansion coefficients of metal and Si.

Moreover, since in the conventional mask, only the top-surface of the aperture is plated with metal, the bottom-surface of the aperture is apt to be charged. If the bottom-surface of the Si-substrate is charged, the path of the electron beams is deformed, and thereby the accurate pattern writing becomes impossible.

In the mask according to the invention, both of the top- and bottom-surfaces of the patterned substrate are plated with metallic films, being based on the recognition of the inventors that the aforementioned metallic films have the same capabilities to intercept the electron beam. Accordingly, there is no necessity for increasing the thickness of each of the aforementioned metallic films, even when the thickness of the substrate in the patterned portion is decreased. Then, the likelihood of exfoliation of the aforementioned metallic films can be reduced, because the thickness of the metallic film can be thinner, and the metallic films are formed on both sides of the patterned substrate and thereby the thermal stresses can be decreased. Moreover, since the substrate with a smaller thickness can be used, the accuracy of fabrication can be increased, and thereby the accuracy of the patterns is considerably improved. Especially, in a case where the thickness of the substrate is less than 15 µm, the required accuracy can be secured without using the newest and expensive etching equipment. Furthermore, since both of the top- and bottom-surfaces of the substrate are covered with the metallic films, electric charges cannot be stored thereon.

Next, an electron beam shaping mask for an electron beam system with pattern writing capability according the invention will be explained in the preferred embodiments referring to appended drawings.

Figure 3:
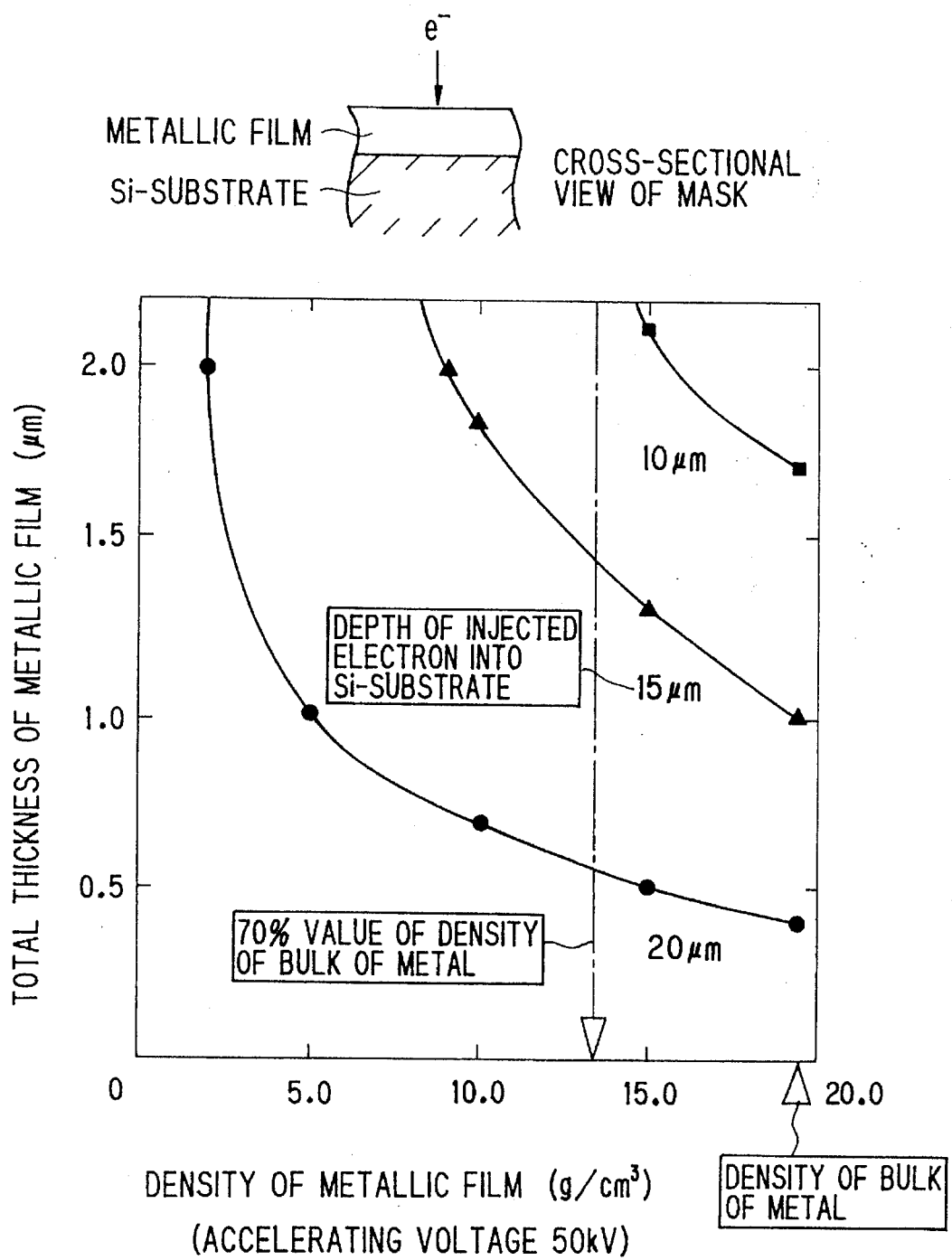
FIG. 3 shows the diagrams representing the relation between the density of a metallic film, the thickness of a metallic film and the depth of an electron injected into the Si-substrate, being obtained by a computer simulation.

FIG. 3 shows the relation between the density (g/cm$^3$) of the metallic film (the Au-film, in this case), the thickness of said metallic film and the required thickness of the mask in other words, (the required thickness of the substrate, which is shown in FIG. 3 as "depth of injected electron into Si-substrate") to intercept the electron beam, in a case where a Gaussian electron beam, being accelerated by a voltage of 50 kV, is used for a pattern writing. The diagrams shown in FIG. 3 are derived by a computer simulation using the Monte Carlo method, and the numerical analysis is performed on the model shown in the upper portion of FIG. 3. A realizable density of an actual Au-film is 10.0~18.9 (g/cm$^3$), and in most cases is about 70% value of the density of Au-bulk (19.3 g/cm$^3$). In a case where the density of the Au-film is assumed to be 13.5 (g/cm$^3$) and the thickness of the Si-substrate is 20 µm, the required thickness of the Au-film is 0.55 µm. Similarly, in a case where the thickness of the substrate is 15 µm, the required thickness of the Au-layer is 14.7 µm. Moreover, it can be seen that the larger the density of the metallic film, the thinner the thickness of the Au-film can be. Other metals than Au can be used for the same purpose, if their densities and their thicknesses of films are nearly equal to those of Au. Hereinafter, the required thickness of the metallic film to intercept the electron beam shall be denoted by t.

Figure 4:
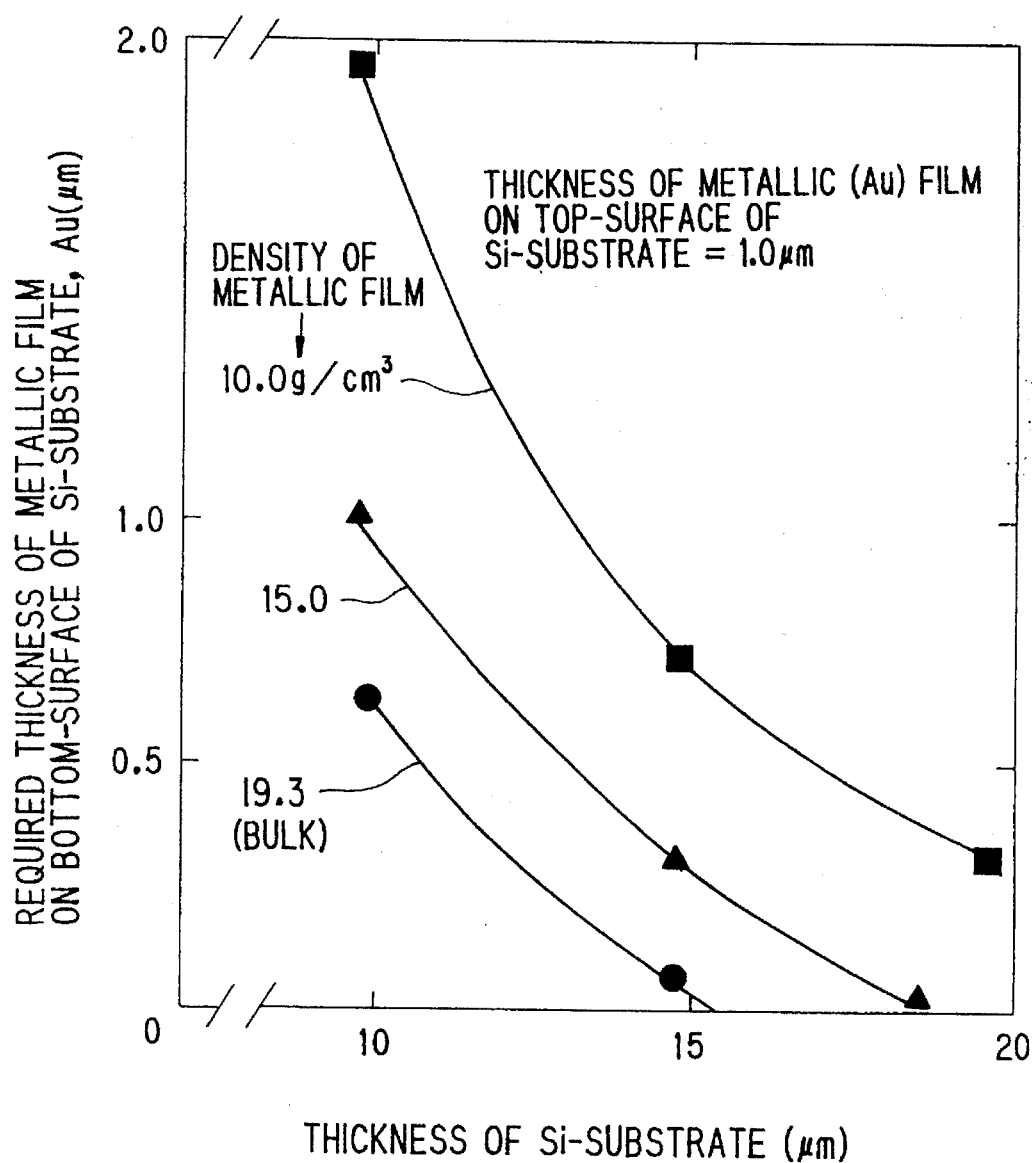
FIG. 4 shows the diagrams representing the relation between the various quantities shown in FIG. 3 in a different way from that of FIG. 3, wherein the thickness of the Au-film on the top-surface of the substrate is fixed to 1.0 μm.

In a case where, the thickness of a metallic film (an Au-film, in this case) on the top surface of the Si-substrate is fixed to 1.0 µm, the relations shown in FIG. 4 hold between the required thickness of the metallic film (the Au-film, in this case) on the bottom-surface of the Si-substrate to intercept the electron beam, the thickness of the Si-substrate and the density (g/cm$^3$) of the metallic film. The diagrams shown in FIG. 4 are derived by a computer simulation using Monte Carlo method. Hereinafter, the required thicknesses of the metallic films formed on the top- and bottom-surfaces to intercept the electron beam shall be respectively denoted by $t_1$, and $t_2$. It can be confirmed that the relation $t=t_1+t_2$ holds, if the densities of the metal are the same in FIGS. 3 and 4. Exactly speaking, when the Au-film is used as the metallic film, an about 500 Å thick foundation layer, being composed of Ti, W or etc., is formed between the Si-substrate and the Au-film. Then, the thickness of the Au-film can be decreased by that of the foundation layer.

Figure 5:
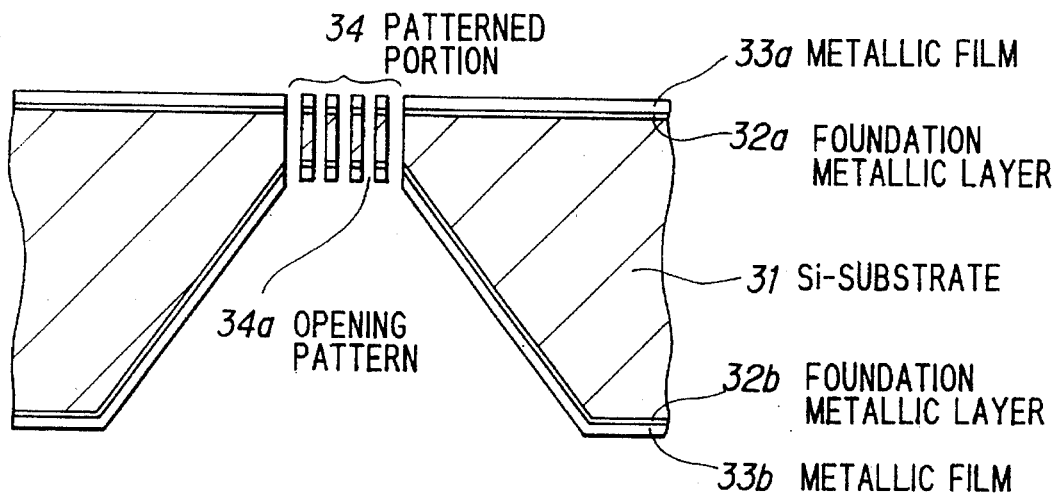
FIG. 5 shows a first preferred embodiment according to the invention.

However, for the simplicity of the explanation, thickness of a metal other than Au is converted into that of Au, and a numerical analysis is performed, as if the metallic layer is composed of Au as a whole. FIG. 5 shows the first preferred embodiment of the invention. As shown in this drawing, a foundation metallic layer 32a composed of Ti and a metallic film 33a composed of Au are successively formed on a top-surface of a Si-substrate 31. Similarly, a foundation metallic layer 32b composed of Ti and a metallic film 33b composed of Au are successively formed on a bottom-surface of the Si-substrate 31. In this embodiment, the thickness of the substrate in a patterned portion 34 is 15 µm, and thereon opening patterns 34as with desired shapes are formed.

As shown in FIG. 3, when the density of the metallic film is 13.5 g/cm$^3$, the required thickness of the metallic film is about 1.5 µm. This fact shows that, the sum of the thicknesses of the metallic films 33a and 33b should be equal to 1.5 µm. Then, if the metallic film 33a on the top-surface of the substrate 31 is 0.75 µm, that on the bottom-surface 33b of the substrate 31 should be 0.75 µm.

Next, when the density of the metallic film is assumed to be 18.9 g/cm$^3$, as extremely difficult to realize this volume is, the total thickness of the metallic layer should be 1.0 µm from FIG. 3. If the thickness of the metallic film 33a on the top-surface of the Si-substrate is 0.5 µm, the thickness of the metallic film 33b on the bottom-surface of the Si-substrate should be 0.5 µm.

Figure 6:
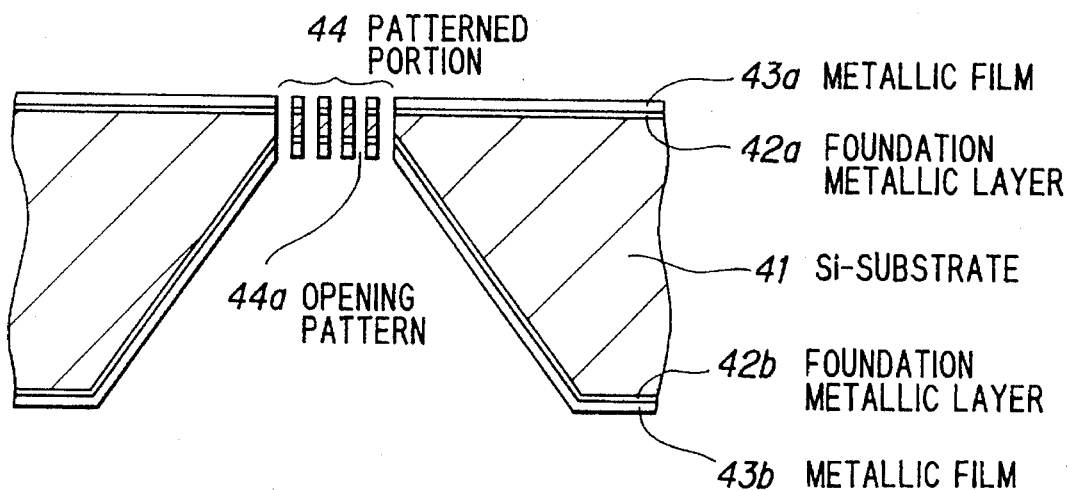
FIG. 6 shows a second preferred embodiment according to the invention.

FIG. 6 is a cross-sectional view showing the structure of the second preferred embodiment. In FIGS. 5–6, structural elements, which are denoted by the same reference numerals except the tenth digit, have the same roles and the same functions, and redundant explanations will be omitted. In the embodiments shown in FIG. 6, the thickness of the substrate is 12 µm at the patterned portion 44.

In this case, it can be seen from FIG. 3 that the sum of the thicknesses of the metallic films 43a and 43b should be about 2.0 µm, on assuming that the density of the metallic films is 13.5 g/cm$^3$. If the thickness of the metallic film 43a on the top-surface of the substrate is 1.0 µm, the thickness of the metallic film 43b on the bottom-surface should be 1.0 µm.

The two preferred embodiments have been described above. The applications of the invention, however, are not restricted to aforementioned embodiments, and several modifications and improvements may be made, without affecting the substance of the invention. For example, in the aforementioned embodiment, the Au-film with the Ti-foundation-layer is used to intercept the electron beam. However, Ti, Ta, TiW, W, Cu, Ag, Al-Si-Cu or etc., can be used as a metallic film by itself, or together with a foundation metallic layer. Moreover, in the aforementioned embodiments, the metallic films with the same thickness are used on the top- and bottom- surfaces of the Si-substrate. However, this condition is not necessary, and for example, the metallic film on the top-surface of the substrate may be thicker. Moreover, the electron beam shaping mask according to the invention can be applicable to both of the first and second beam shaping masks of the electron beam system shown in FIG. 1. Still further, the method of forming the metallic films on the surfaces of the Si-substrate is never limited to plating, and a sputtering or evaporation method also can be applied.

As explained above, since a beam shaping mask for an electron beam system with pattern writing capability according to the invention is fabricated by plating both of the top- and bottom- surfaces of the substrate with a metal, effects obtained can be summarized as follows.

(1) Since the metallic films are formed on top- and bottom-surfaces of a substrate, thicknesses of each of said metallic films can be made thinner as compared with that in a case where a metallic film is formed only on the top-surface of the substrate. Accordingly, thermal stresses applied to the metallic films become smaller, and exfoliations of the metallic films can be avoided.

(2) Since the sum of the thicknesses of the metallic films formed on the top- and bottom- surfaces on the substrate can be large, the thicknesses of the patterned portion of the substrate can be thin. Hence, the depth of the etching for forming opening patterns can be shallow, so that opening patterns on the mask with high accuracy can be provided. Especially, when the thickness of the substrate on the patterned portion is less than 15 µm, highly accurate patterns can be obtained, even when an older model etching equipment is used, and consequently products with high quality can be supplied at low cost.

(3) Since no electric charges are stored on the bottom-surface of the substrate, there is no likelihood of the deflection of the electron beam caused by electrostatic forces between the electron beam and the electric charges stored on the substrate, and therefore patterns can be accurately written on the wafer.

What is claimed is:

1. An electron beam shaping mask for an electron beam system with pattern writing capability, comprising:

a substrate patterned with prescribed opening patterns, and metallic films, which cover entire top- and bottom-surfaces of said substrate except said prescribed opening patterns, said metallic films and said substrate at said prescribed opening patterns for shielding electron beams.

2. An electron beam shaping mask as defined in claim 1, wherein:

a thickness of said substrate and a sum of thicknesses of said metallic films are so selected that said beam shaping mask can intercept said electron beam, being accelerated by a prescribed voltage.

3. An electron beam shaping mask as defined in claim 1, wherein:

said substrate is composed of a single crystal silicon.

4. An electron beam shaping mask as defined in claim 1, wherein:

each of said metallic films is an Au-film with foundation layers composed of metals other than Au.

5. An electron beam shaping mask as defined in claim 1, wherein:

at least one metal selected from Ti, Ta, TiW, W, Cu, Ag and Al-Si-Cu mainly composes said metallic films.

6. An electron beam shaping mask for defining an electron beam pattern on a semiconductor substrate, comprising:

a mask substrate having a first portion of a first thickness and a second portion of a second thickness less than said first thickness, said second portion being provided with openings to define said electron beam pattern, and said second thickness being dependent on a precision of inner walls of said openings; and first and second metallic films deposited on top and bottom surfaces of said mask substrate, respectively, said metallic films and said substrate at said openings for shielding electron beams.

7. An electron beam shaping mask as defined in claim 1, wherein said substrate is composed of a Si layer, wherein a thickness of said Si layer of the prescribed opening patterns is between 10 μm to 20 μm, and said metallic films are composed of Au.

8. An electron beam shaping mask as defined in claim 2, wherein said substrate is composed of a Si layer,
   wherein a thickness of said Si layer of the prescribed opening patterns is between 10 μm to 20 μm, and said metallic films are composed of Au.

9. An electron beam shaping mask as defined in claim 1, wherein a thickness of the metallic films is selectively adjusted determined based on a density of the material of the metallic films, and a thickness of an aperture of said electron beam shaping mask,
   said prescribed opening patterns providing electron beam-intercepting areas,
   wherein a total thickness of said electron beam-intercepting areas and said metallic films is set to intercept electron beams, a total thickness of said metallic films being set reversely proportional to a density of said metallic films.

10. An electron beam shaping mask as defined in claim 2, wherein a thickness of the metallic films is selectively adjusted determined based on a density of the material of the metallic films, and a thickness of an aperture of said electron beam shaping mask,
    said prescribed opening patterns providing electron beam-intercepting areas,
    wherein a total thickness of said electron beam-intercepting areas and said metallic films is set to intercept electron beams, a total thickness of said metallic films being set reversely proportional to a density of said metallic films.

11. An electron beam shaping mask as defined in claim 1, wherein a thickness of a metallic film on a top surface of said substrate is one of greater than and the same as a thickness of a metallic film on a bottom surface of said substrate.

12. An electron beam shaping mask as defined in claim 6, wherein a thickness of the first and second metallic films is selectively adjusted determined based on a density of the material of the first and second metallic films, and a thickness of an aperture of said electron beam shaping mask,
    said openings providing electron beam-intercepting areas,
    wherein a total thickness of said electron beam-intercepting areas and said first and second metallic films is set to intercept electron beams, a total thickness of said first and second metallic films being set reversely proportional to a density of said first and second metallic films.

13. An electron beam shaping mask as defined in claim 6, wherein said mask substrate is composed of a Si layer, a thickness of said Si layer of the openings is 10 μm to 20 μm, wherein said first and second metallic films are composed of Au,
    wherein a thickness of said first metallic film on said top surface of said mask substrate is one of greater than and the same as a thickness of said second metallic film on said bottom surface of said mask substrate.

14. An electron beam shaping mask as defined in claim 6, wherein a thickness of said first metallic film on said top surface of said mask substrate is one of greater than and the same as a thickness of said second metallic film on said bottom surface of said mask substrate.

15. An electron beam shaping mask as defined in claim 6, wherein said mask substrate is composed of a Si layer,
    wherein a thickness of said Si layer of the openings is between 10 μm to 20 μm, and said first and second metallic films are composed of Au.

16. An electron beam shaping mask for an electron beam system with pattern writing capability, comprising:
    a substrate having an opening pattern portion thinner than a remaining portion, said opening pattern portion being formed with prescribed openings to provide electron beam-intercepting areas; and
    metallic films provided on top- and bottom surfaces of said electron beam-intercepting areas,
    wherein a total thickness of said electron beam-intercepting areas and said metallic films is set to intercept electron beams, a total thickness of said metallic films being set reversely proportional to a density of said metallic films.

17. The mask as defined in claim 16, wherein said substrate is a silicon substrate,
    a thickness of said silicon substrate ranging from 10 to 20 μm, and wherein said total thickness of said metallic films ranges between 0.5 to 2.2 μm in accordance with said density ranging from 10.0 to 15.0 g/cm³, said metallic films being composed of Au.

18. The mask as defined in claim 16, wherein said substrate is composed of a Si layer, a thickness of the opening pattern portion of said substrate ranging from 10 to 20 μm.

19. The mask as defined in claim 18, wherein said metallic films and said substrate are for shielding electron beams, and wherein said total thickness of said metallic films ranges between 0.5 to 2.2 μm in accordance with said density ranging from 10.0 to 15.0 g/cm³, said metallic films being composed of Au.

20. The mask as defined in claim 16, wherein a thickness of a metallic film on a top surface of said electron beam-intercepting areas is one of greater and the same as a thickness of a metallic film on a bottom surface of said electron beam-intercepting areas.

* * * * *